(12) United States Patent
Collier et al.

(10) Patent No.: US 6,968,168 B1
(45) Date of Patent: Nov. 22, 2005

(54) VARIABLE OSCILLATOR

(75) Inventors: James Digby Yarlet Collier, Ely (GB); Ian Michael Sabberton, Weston Green (GB)

(73) Assignee: Cambridge Silicon Radio Ltd., Cambridge (GB)

(*) Notice: Subject to any disclaimer, the term of this patent is extended or adjusted under 35 U.S.C. 154(b) by 0 days.

(21) Appl. No.: 09/618,296

(22) Filed: Jul. 18, 2000

(30) Foreign Application Priority Data

Jul. 19, 1999 (GB) .................................. 9916907

(51) Int. Cl.⁷ .............................................. H04B 7/00
(52) U.S. Cl. .................... 455/264; 455/265; 455/261; 455/262; 455/255; 455/278.1; 455/231; 455/208; 455/166.2; 455/326; 455/193.3; 326/98; 331/116 R; 331/1 A
(58) Field of Search ............................. 455/231, 326, 455/348, 193.3, 291, 76, 208, 166.2, 264, 455/265, 261, 262, 255, 278.1; 326/98; 331/116 R, 331/1 A

(56) References Cited

U.S. PATENT DOCUMENTS

| 5,625,325 A | 4/1997 | Rotzoll et al. |
| 5,686,864 A | 11/1997 | Martin et al. |
| 5,880,643 A | 3/1999 | Bjork et al. |
| 6,172,576 B1 * | 1/2001 | Endo et al. ............. 331/116 R |
| 6,377,315 B1 | 4/2002 | Carr et al. |
| 6,426,680 B1 | 7/2002 | Duncan et al. |

FOREIGN PATENT DOCUMENTS

| EP | 0 720 299 A1 | 7/1996 |
| FR | 2 612 017 A1 | 9/1988 |
| GB | 2 120 478 A | 11/1983 |

* cited by examiner

Primary Examiner—Joseph Feild
Assistant Examiner—David Q. Nguyen
(74) Attorney, Agent, or Firm—Rothwell, Figg, Ernst & Manbeck

(57) ABSTRACT

A variable frequency oscillator comprising: an oscillatory circuit for generating a periodic output dependent on the capacitance between a first node and a second node of the circuit, and having a capacitative element connected between the first node and the second node; the capacitative element comprising: a variable capacitance unit, the capacitance of which is variable for varying the frequency of the output and a plurality of finite capacitances each being selectively connectable in parallel with the variable capacitance unit between the first node and the second node to trim the frequency of the output.

15 Claims, 3 Drawing Sheets

VARIABLE OSCILLATOR

FIELD OF INVENTION

This invention relates to variable oscillators, in particular oscillators whose frequency of oscillation is variable in response to a frequency setting signal and which can be trimmed by means of a separate trimming signal.

BACKGROUND OF THE INVENTION

FIG. 1 shows one form of a variable oscillator. The circuit of FIG. 1 includes a resonant portion 1, which produces an oscillating signal at 2, and an amplifying stage 3, which enhances the signal at 2 by sustaining the resonance of the resonant portion and amplifying it to yield on oscillator output signal at 4. The resonant portion comprises a capacitance 5 and an inductance 6 connected in series. The capacitance is a variable capacitance ("varicap") diode 7 whose capacitance varies in dependence on the voltage applied at a control input 8. Thus the frequency of the oscillator can be varied by means of that voltage, and the oscillator is a voltage-controlled oscillator.

In many applications of oscillators such as the one shown in FIG. 1 there is a need to arrange the oscillator accurately so that a pre-defined range of frequencies can then be tuned over exactly using the varicap diode 7. For example, in many communications applications the oscillator may be required to operate at one of a number of pre-defined frequencies that correspond to the frequencies of available communication channels. In order for the communications terminal that uses the oscillator to establish communication with another terminal the frequencies used by the two terminals must match each other precisely. In production there is often significant variation between the values of the circuit components between individual oscillators. This is especially significant when the oscillator is built on-chip. (Typical variation in the values of on-chip components are: ±30% for resistors, ±10% for capacitors and ±7% for inductors; the values also being strongly dependant on temperature). Therefore, it is common for the oscillator to be trimmed after production so that the pre-determined channel frequencies can then each be selected by applying a corresponding channel-setting voltage at the control input 8.

One way to perform the trimming operation is by using the varicap diode 7 itself. A trimming offset voltage can be applied to the control input 8 to ensure that when the channel-setting voltages are also applied to the control input 8 the pre-determined channel frequencies are generated accurately. However, this approach requires the varicap diodes to have sufficient throw (range) to be capable of adjusting the resonant frequency not just over the frequency envelope of the available channels but also over an additional range to cope with the need for trimming the circuit. The required total throw is typically around 30%. The effect of this is that, compered to one of smaller throw, the varicap diode is more sensitive to the voltage at the control input 8. As a result, in normal operation it is more difficult to control the varicap diode accurately. Furthermore, the wide pull range implies that much of the oscillation energy of the circuit passes via the varicap diode 7, which typically have much higher losses (i,e. lower Q) than fixed value capacitors. High loss causes poor phase noise, which substantially degrades the performance of radio receivers, which are a common application of variable oscillators. Another problem is that if the varicap diode has a large throw then the variation in voltage at the control input 9 as a result of the oscillation can itself alter the capacitance of the varicap and therefore modulate the frequency of the circuit. In addition, where the oscillator is used with a phase-locked loop (PLL) the wide range of effective capacitance of the varicap 7 means that the loop gain of the PLL is subject to variation. This results in poor settling, which is not compatible with the rapid jumps needed for frequency hopping systems. Although this can be addressed by introducing an adjustment for the loop time constant, this is an expensive operation during manufacture.

Another approach is to use the circuit of FIG. 2. In FIG. 2 like components are numbered as for FIG. 1. In the circuit of FIG. 2 an additional mechanical trimmer 9 is provided in the capacitative portion 5 of the oscillator. This allows a varicap diode of smaller throw to be used. However, the mechanical trimmer is bulky, relatively expensive and requires an inconvenient step of mechanical adjustment during production. As an alternative to a mechanical trimmer the capacitance 9 could be provided by a on-chip (monolithic) capacitor that can be adjusted during production by laser trimming. However, this approach is inconvenient because it can only be done before the monolithic component is packaged, and expensive because the laser trimming step has a low yield and is incompatible with conventional integrated circuit (IC) processes.

In another known arrangement the continuously variable capacitance unit (e.g. represented by varicap 7 in FIG. 1) are arranged in parallel with a finitely variable capacitance arrangement which is capable of capacitance steps just a little smaller than the sweep range of the finitely variable capacitance. With this arrangement a first coarse tuning operation can be carried out after manufacture using the finitely variable capacitance arrangement to bring desired capacitances within the sweep range of the continuously variable capacitance. The setting of the finitely variable arrangement is then fixed. Then during use the continuously variable capacitance can be adjusted to give precisely the desired capacitance. However, the coarseness of the first tuning operation means that the continuously variable capacitance frequently has to operate substantially outside its optimum range.

There is a need for a variable frequency oscillator that can be trimmed more easily and economically, without significant deterioration in performance.

SUMMARY OF THE INVENTION

According to one aspect of the present invention there is provided a variable frequency oscillator comprising: an oscillatory circuit for generating a periodic output dependent on the capacitance between a first node and a second node of the circuit, and having a capacitative element connected between the first node and the second node; the capacitative element comprising: a variable capacitance unit, the capacitance of which is variable for varying the frequency of the output; and a plurality of trimming capacitances each being selectively connectable between the first node and the second node in parallel with the variable capacitance unit to trim the frequency of the output. In this aspect of the invention a switch (preferably an electrically sensitive switch such as a transistor) is suitably connected in series with each trimming capacitance between the first node and the second node for selectively connecting the respective trimming capacitance between the first node and the second node in response to a respective switching signal.

According to a second aspect of the present invention there is provided a variable frequency oscillator comprising:

an oscillatory circuit for generating a periodic output dependant on the capacitance between a first node and a second node of the circuit, and having a capacitative element connected between the first node and the second node; the capacitative element comprising: a variable capacitance unit, the capacitance of which is variable for continuously varying the frequency of the output over a frequency range; and a plurality of trimming capacitances each being selectively connectable in series with the capacitative element to trim the frequency of the output in steps of less than half the width of the said frequency range.

The trimming capacitances are preferable finite capacitances.

The plurality of trimming capacitances preferably provide a finitely variable capacitance unit. The trimming capacitances are suitably selectively connectable in parallel with each other.

The oscillator may comprise control apparatus for causing a set of the trimming capacitances to be connected between the first node and the second node. The oscillator may also comprise a memory coupled to the control apparatus for storing information defining one or more sets of the trimming capacitances. The control apparatus and/or the memory may also perform other functions in any device of which the oscillator forms part. Each of the said one or more sets may correspond to a respective operating frequency of the oscillator. The control apparatus may be capable of retrieving the information defining one of the sets in response to information defining an operating frequency being supplied to the control apparatus. The control apparatus may be capable of retrieving from the memory information defining one of the sets and then causing that set of the trimming capacitances to be connected between the first node and the second node.

At least one of the trimming capacitances may have a different capacitance value from another of tile trimming capacitances. Preferably all of their values are different.

The trimming capacitances are preferably capable of trimming the frequency of the output in steps of less than half, and most preferably less than a tenth of the width of the frequency range over which the continuously variable capacitative element is by itself capable of providing adjustment. The trimming capacitances preferably provide for more than 10 and most preferably more than 40 or 50 finite adjustment steps.

The capacitance of the variable capacitance unit may be variable by means of the voltage applied to an input of the variable capacitance. There may be feedback apparatus such as a phase-locked loop connected between the output and the variable capacitance input for stabilising the oscillator. The variable capacitance unit is preferably continuously variable.

The oscillator, or the oscillatory circuit, is preferably formed on a single integrated circuit.

The present invention also provides a method for operating a variable frequency oscillator as described above, the method comprising: retrieving from the memory information defining a set of the trimming capacitances; connecting that set of the trimming capacitances between the first node and the second node; comparing the voltage at the variable capacitance input with a first preset voltage range; and if that voltage is outside the first preset voltage range determining, based on the voltage at the variable capacitance input, an adjusted set of the trimming capacitances and storing in the memory information defining that adjusted set of the trimming capacitances. The said step of determining may be performed only if the voltage at the variable capacitance input is inside a second preset voltage range. In the step of storing, the information defining the adjusted set of the trimming capacitances may be stored so as to replace in the memory the said information defining a set of the trimming capacitances.

BRIEF DESCRIPTION OF THE DRAWINGS

The present invention will now be described by way of example, with reference to the accompanying drawings, in which:

In FIGS. 3, 4 and 5 like components are numbered as for FIG. 1.

DESCRIPTION OF THE PREFERRED EMBODIMENTS

Figure 1:
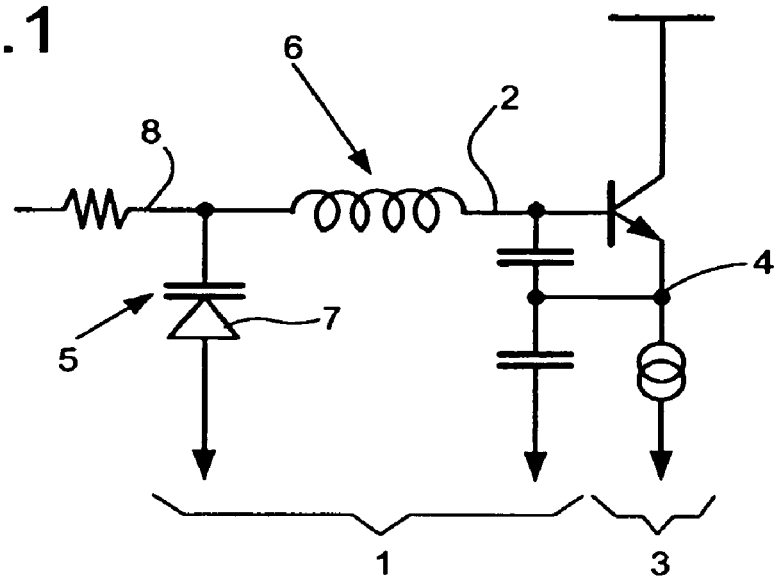
FIG. 1 shows one form of a variable oscillator.
Figure 2:
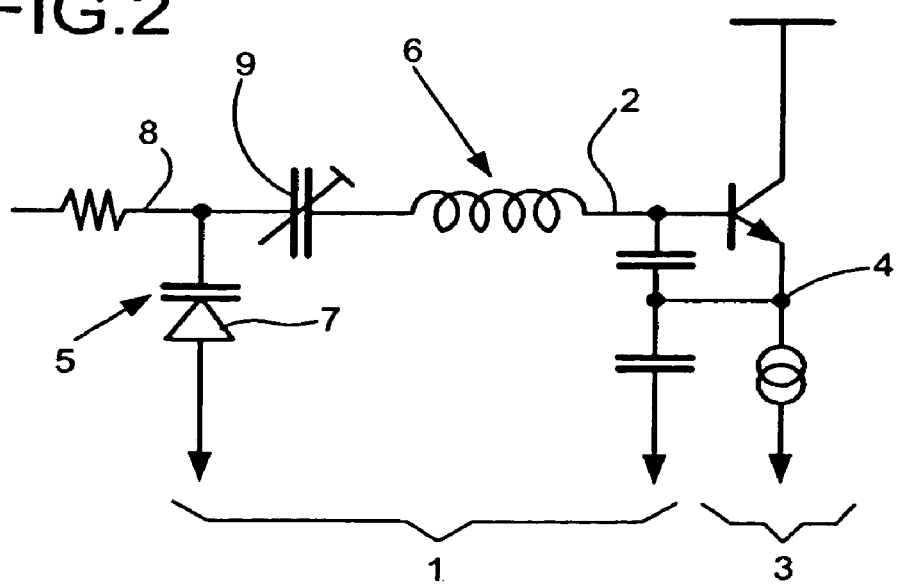
FIG. 2 shows another form of a variable oscillator.
Figure 3:
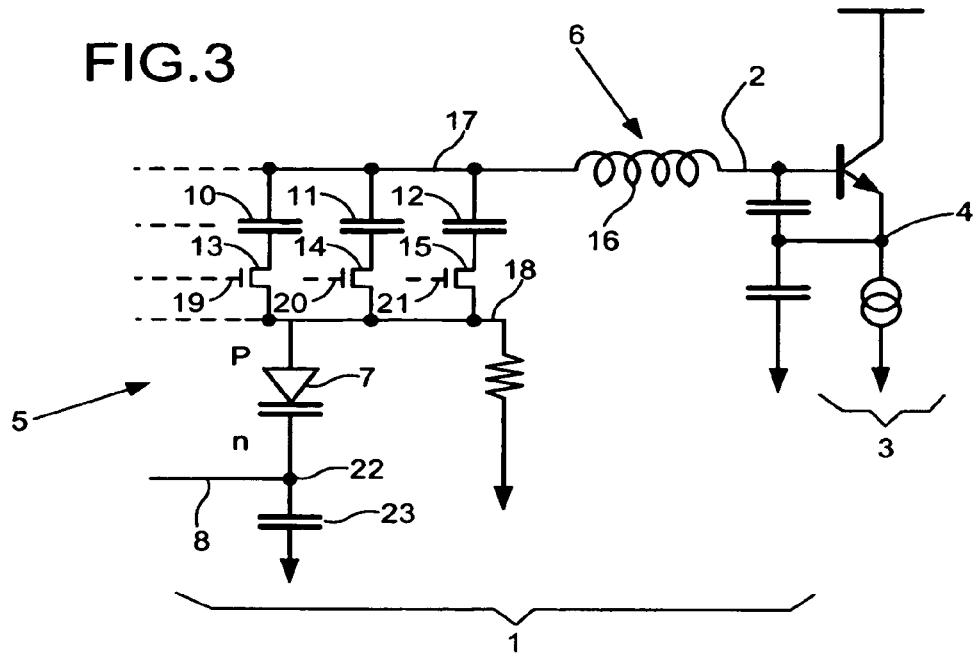
FIGS. 3 and 5 show the circuit of a variable frequency oscillator.

FIG. 3 shows a variable oscillator circuit for a radio terminal, which can be implemented on a single integrated circuit. The variable oscillator circuit shown in FIG. 3 comprises a resonant section 1 and an amplification stage 3. The resonant section includes a capacitative section indicated generally at 5 and 6 and an inductive section 7. In the circuit of FIG. 3 the capacitative sections include an array of switchable trimming capacitances 10, 11, 12 etc. which can be selectively switched into the resonant circuit by respective transistors 13, 14, 15 etc. to allow the circuit to be trimmed digitally.

In more detail, the resonant section of FIG. 3 includes an inductance 16 connected between node 17 and the output node 2 of the resonant section. The capacitors 10–12 are connected in parallel between node 17 and node 18. In series with each capacitor 10–12 is a respective switching transistor 13–15. Each switching transistor is connected so that when a suitable voltage is applied to its gate from the corresponding switching input line 19–21 current can flow between its source and drain so that the capacitor with which it is connected in series is coupled between node 17 and node 18. A varicap diode 7 is connected between node 18 and node 22. Node 22 receives a voltage input from 8 to select the operating frequency of the oscillator in use. Node 22 is decoupled from ground at radio frequency by decoupling capacitor 23.

After the circuit has been manufactured on-chip it can be trimmed by switching one or more of the capacitors 10–12 etc. fully into or out of the circuit between nodes 17 and 18 and thereby altering the effective capacitance of the whole resonant section 1 of the oscillator.

The trimming of the circuit could be performed each time the terminal is turned on, for example by comparing the output of the circuit with a standard received frequency. Alternatively, the trimming operation could be performed at the manufacture stage. Since each trimming capacitance is switched fully into or out of the circuit the trimming is a digital operation. The setting of the switching transistors 13–15 etc. can be represented as a binary number with one digit corresponding to the switching input to each switching transistor. The setting of the trimming capacitors can therefore be stored digitally by memory of the radio terminal during manufacture or use and reproduced exactly when required by recalling the appropriate setting from memory.

More than one setting could be stored (either at manufacture or during use) for different applications, such as different operating frequencies or temperatures.

Figure 4:
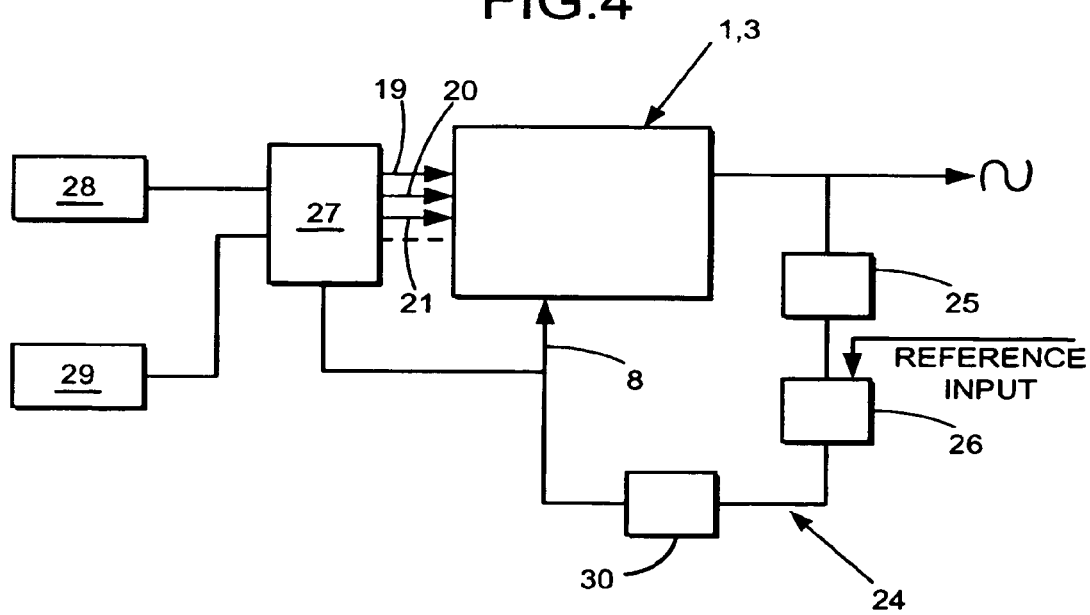
FIG. 4 shows a control arrangement for the circuit of FIGS. 3 and 5.

FIG. 4 shows one preferred arrangement for controlling the oscillator 1, 3. The output of the oscillator passes to a PLL 24 comprising a divider 25, a phase detector 26 and a loop filter 30. The difference in phase of the divided signal and reference signal is fed back to the control input 8 of the oscillator. The switching control inputs 19–21 etc. of the oscillator are driven from an oscillator control unit 27. The control unit is under the supervision of a main processor 28 of the radio terminal. The control unit 27 monitors the voltage at control input 8. The control unit 27 adjusts the switching of the trimming capacitors with the aim that the voltage at 8 is as close as possible to a preset value. By performing this operation at each operating frequency of the terminal, the control unit 27 keeps the loop gain of the circuit relatively constant.

The control unit 27 could retrieve preferred settings for the switching inputs 19–21 etc. at each operating frequency from memory 29. To switch frequencies the control unit could then apply the stored settings to the inputs 19–21 and leave the analogue PLL to settle any residual frequency error. In this arrangement there could be no need for the control unit to influence the voltage on input 8 directly, so the oscillator control could be fully digital. The combined setting of the inputs 19–21 etc. could be viewed as a multi-bit binary trimming set signal from control unit 27.

The table of trim code settings for the switching inputs 19–21 could be stored in memory (e.g. as a table of multi-bit binary numbers) by the control unit 27, during start-up or as a background task, or during manufacture of the terminal. One algorithm for assembling the table during use is as follows:

1. Apply to the switching inputs the digital code stored in the look-up table for an operating frequency.
2. Wait for the PLL to stabilise.
3. Digitise the voltage at the varicap input 8 by means of an A-D converter in the control unit 27.
4. Compare the digitised voltage with a first preset voltage window. If the voltage is inside the first preset window then keep the present digital code setting.
5. If the voltage at the varicap input is outside the first preset window then compare the digitised voltage with a second, wider preset window. If the voltage is inside the second preset window then maintain the present digital code settings for the current radio activity (e.g. for transmitting or receiving a packet or burst of data) but adjust the code stored for the present frequency so as to increment or decrement (as appropriate) the trimming capacitance that is switched in for the present operating frequency. The adjusted code will then be employed the next time the present frequency is chosen.
6. If the voltage at the varicap input is outside the second window (in which case the unit is off-tune) abort the current radio activity and enter a re-calibration mode.

This method could also be used during a built-in self-test (BIST) operation in the terminal. The above method could be cycled through for each operating frequency. A self-test feature of this type can yield significant cost savings during production and is desirable for ensuring proper operation during use.

Whilst the transceiver is enabled it preferably continuously monitors and adjusts the digital code applied to the transistor switches to keep the analogue variable capacitance at or near its optimum capacitance value.

The array of capacitors may include any number of capacitors from two upwards. The values of the trimming capacitors could be the same or different. If the values of the trimming capacitors am different then the same number of trimming capacitors can be used ta allow trimming over a wider range, saving an IC real estate. The trimming capacitors could suitably provide 128 equal steps of total capacitance. This could, for instance, be achieved by 128 capacitors of the same value, or 7 capacitors of values scaled factors of two apart.

In the re-calibration mode the control unit 27 could repeatedly monitor the voltage at the varicap input and increase or decrease the effective total trimming capacitance by switching one or more trimming capacitors in or out as appropriate until the varicap input voltage is within the first or second window. If the steps in values of the trimming capacitors are the same then a very simple trimming algorithm can be used in the control unit 27 to adjust the effective total trimming capacitance monotonically simply by switching in more or fewer capacitors. If the values of the capacitors are different then the trimming algorithm should take this into account.

Step 5 of the algorithm set out above is especially beneficial because it allows for gradual changes to counteract drifts (due, for instance, to temperature fluctuations) without the need for full re-calibration.

Figure 5:
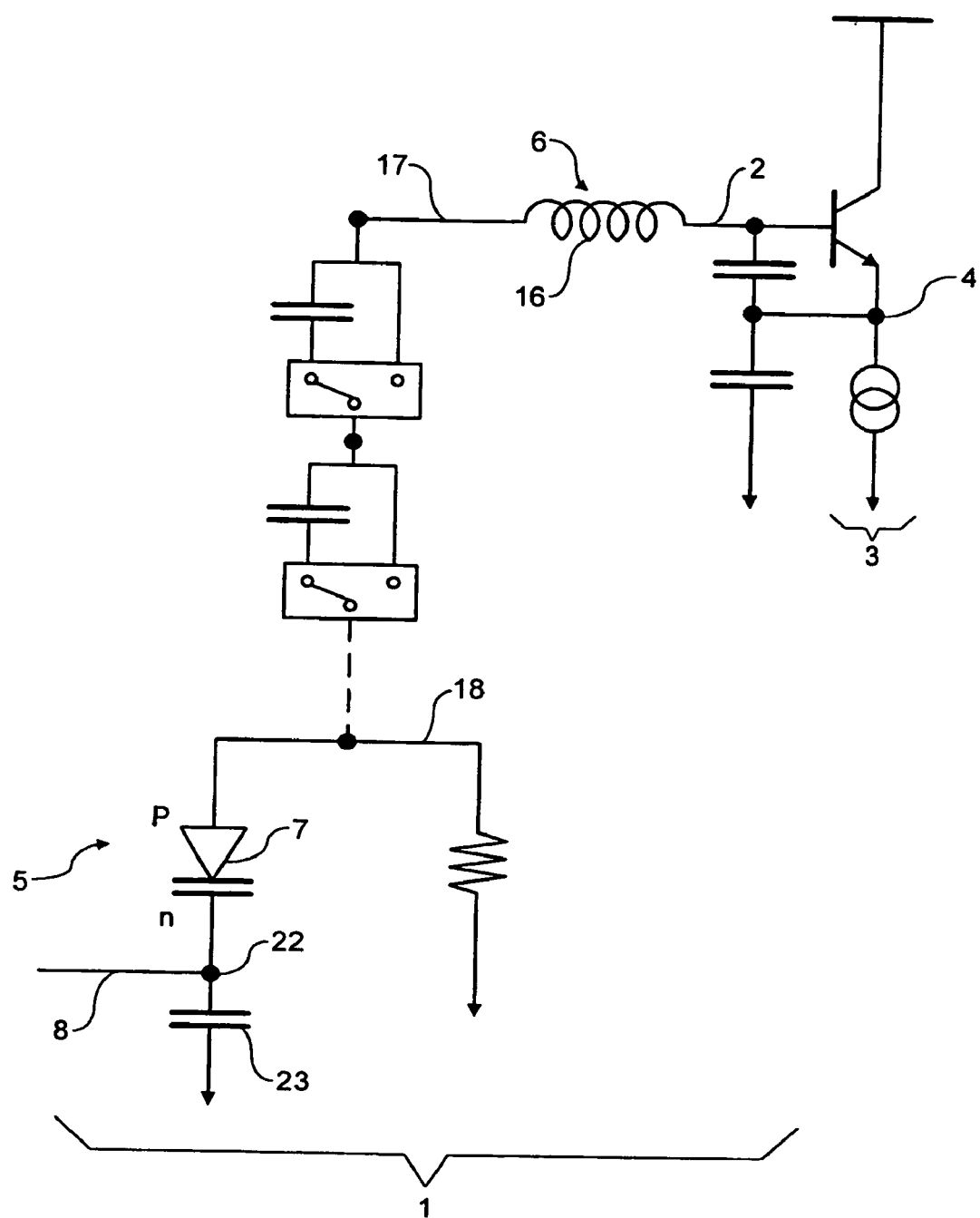

The trimming capacitors 10–12 are in parallel with each other and in series with the varicap diodes, as shown in FIG. 3. The trimming capacitors could alternatively be in series with each other and with the varicap diodes, as shown in FIG. 5.

The finitely adjustable portion of the capacitative section preferably allows around 50 or more finite capacitance steps, with a step size substantially smaller than the range of the varicap. This allow the varicap to be not just pulled into range at a selected finite step, but to be arranged so that a desired narrow part of its continuously variable range will yield the desired capacitance. This provides better control of loop time constant and loop response compared to a system in which at only one step setting can the varicap give the desired overall capacitance.

The range of the continuously variable capacitance (in this example the varicap) preferably provides for frequency adjustment over a very much smaller range than the total range of variation available from the capacitative section including also the finitely variable capacitance circuitry. This provides much better phase noise performance than a system in which the continuously variable capacitance accounts for a major proportion of the total adjustment range. The radio terminal could be a radio transmitter and/or receiver. The terminal could operate according to any suitable scheme, including TDMA (time division multiple access) and FHSS (frequency hopped spread spectrum). The oscillator could be used in other applications such as tone generation.

Numerous changes could be made to the circuits shown in FIGS. 3 and 4. For example, the output stage of the oscillator could be varied as required. The varicap 7 could be replaced or supplemented by one or more other forms of voltage, current or manually controlled capacitance, or only one variable capacitance section used, rather than the symmetric example shown in FIG. 3.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. A variable frequency oscillator comprising:
    an oscillatory circuit for generating a periodic output dependant on the capacitance between a first node and a second node of the circuit, and having a capacitative element connected between the first node and the second node; the capacitative element comprising:
    a variable capacitance unit, the capacitance of which is variable by means of a voltage applied to a variable capacitance input for varying the frequency of the output;
    a plurality of trimming capacitances each being selectively connectable to the variable capacitance unit to trim the frequency of the output;
    a memory for storing information defining one or more sets of the trimming capacitances; and
    control apparatus coupled to the memory for causing a set of the trimming capacitances to be connected to the variable capacitance unit by the steps of:
    retrieving from the memory information defining a set of the trimming capacitances;
    connecting that set of the trimming capacitances to the variable capacitance unit;
    comparing the voltage at the variable capacitance input with a first preset voltage range; and
    if that voltage is outside the first preset voltage range, determining, based on the voltage at the variable capacitance input, an adjusted set of the trimming capacitances and storing in the memory information defining that adjusted set of the trimming capacitances.

2. The variable frequency oscillator of claim 1, wherein the trimming capacitances are each selectively connectable between the first node and an intermediate node, and wherein the variable capacitance unit is connected between the second node and the intermediate node.

3. The variable frequency oscillator of claim 1, wherein the trimming capacitances are each selectively connectable in parallel with each other.

4. The variable frequency oscillator of claim 1, wherein a switch is connected in series with each trimming capacitance for selectively connecting the respective trimming capacitance to the variable capacitance unit in response to a respective switching signal.

5. The variable frequency oscillator of claim 4, wherein each switch is a switching transistor.

6. The variable frequency oscillator of claim 1, wherein the control apparatus is capable of generating the switching signals.

7. The variable frequency oscillator of claim 1, wherein each of the said one or more sets corresponds to a respective operating frequency of the oscillator.

8. The variable frequency oscillator of claim 1, wherein at least one of the trimming capacitances has a different capacitance value from another of the trimming capacitances.

9. The variable frequency oscillator of claim 1, comprising feedback apparatus connected between the output and the variable capacitance input for stabilising the oscillator.

10. The variable frequency oscillator of claim 9, wherein the feedback apparatus is a phase-locked loop.

11. The variable frequency oscillator of claim 1, wherein the variable capacitance unit is a variable capacitance diode.

12. A radio terminal comprising a variable oscillator as claimed in claim 1.

13. The method of claim 1, wherein the step of determining is performed only if the voltage at the variable capacitance input is inside a second preset voltage range.

14. The method of claim 1, wherein, in the step of storing, the information defining the adjusted set of the trimming capacitances is stored so as to replace in the memory the said information defining a set of the trimming capacitances.

15. The variable frequency oscillator of claim 1, wherein the trimming capacitances are each selectively connectable in series with each other.

* * * * *